(12) United States Patent
Nakatani et al.

(10) Patent No.: US 7,870,429 B2
(45) Date of Patent: Jan. 11, 2011

(54) CONTROL APPARATUS

(75) Inventors: Hiroshi Nakatani, Tama (JP); Yoshito Sameda, Yokohama (JP); Akira Sawada, Kiyose (JP); Jun Takehara, Tokyo (JP); Kouichi Takene, Higashikurume (JP); Hiroyuki Nishikawa, Iruma (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 12/141,365

(22) Filed: Jun. 18, 2008

(65) Prior Publication Data

US 2008/0320331 A1 Dec. 25, 2008

(30) Foreign Application Priority Data

Jun. 22, 2007 (JP) .......................... P2007-165288

(51) Int. Cl.
G06F 11/00 (2006.01)

(52) U.S. Cl. .............................. 714/30; 714/27; 714/31; 714/727

(58) Field of Classification Search ................... 714/10, 714/11, 27, 30, 31, 727
See application file for complete search history.

(56) References Cited

U.S. PATENT DOCUMENTS

| | | | | |
|---|---|---|---|---|
| 6,115,763 A * | 9/2000 | Douskey et al. | ............. | 714/727 |
| 7,062,637 B2 | 6/2006 | Ganapathy et al. | | |
| 7,080,283 B1 * | 7/2006 | Songer et al. | ................... | 714/30 |
| 7,139,947 B2 * | 11/2006 | Miner et al. | ................... | 714/30 |
| 7,475,309 B2 * | 1/2009 | Picano et al. | ............... | 714/727 |
| 7,536,597 B2 * | 5/2009 | McGowan | ................... | 714/30 |
| 7,627,794 B2 * | 12/2009 | Kinter | ......................... | 714/724 |
| 7,636,870 B2 * | 12/2009 | Ueno | .......................... | 714/30 |
| 7,665,002 B1 * | 2/2010 | White et al. | ................. | 714/727 |
| 7,685,487 B1 * | 3/2010 | Kuo et al. | .................... | 714/726 |

FOREIGN PATENT DOCUMENTS

| | | |
|---|---|---|
| EP | 0 382 972 B1 | 8/1990 |
| JP | 9-5400 | 1/1997 |
| JP | 2000-206202 | 7/2000 |
| JP | 2001-306343 | 11/2001 |

OTHER PUBLICATIONS

U.S. Appl. No. 12/108,774, filed Apr. 24, 2008, Sameda, et al.

* cited by examiner

*Primary Examiner*—Robert Beausoliel
*Assistant Examiner*—Joseph D Manoskey
(74) *Attorney, Agent, or Firm*—Oblon, Spivak, McClelland, Maier & Neustadt, L.L.P.

(57) ABSTRACT

For a control apparatus to be boundary scan testable even when running, including processor cores in an operator to be capable of self-repairing a troubling part, an operator (2) has processor cores (2a, 2b) connected to a boundary scan bus (12), and adapted to mutually diagnose opponent processor cores for troubles, by boundary scan testing each other in a time-dividing manner.

8 Claims, 10 Drawing Sheets

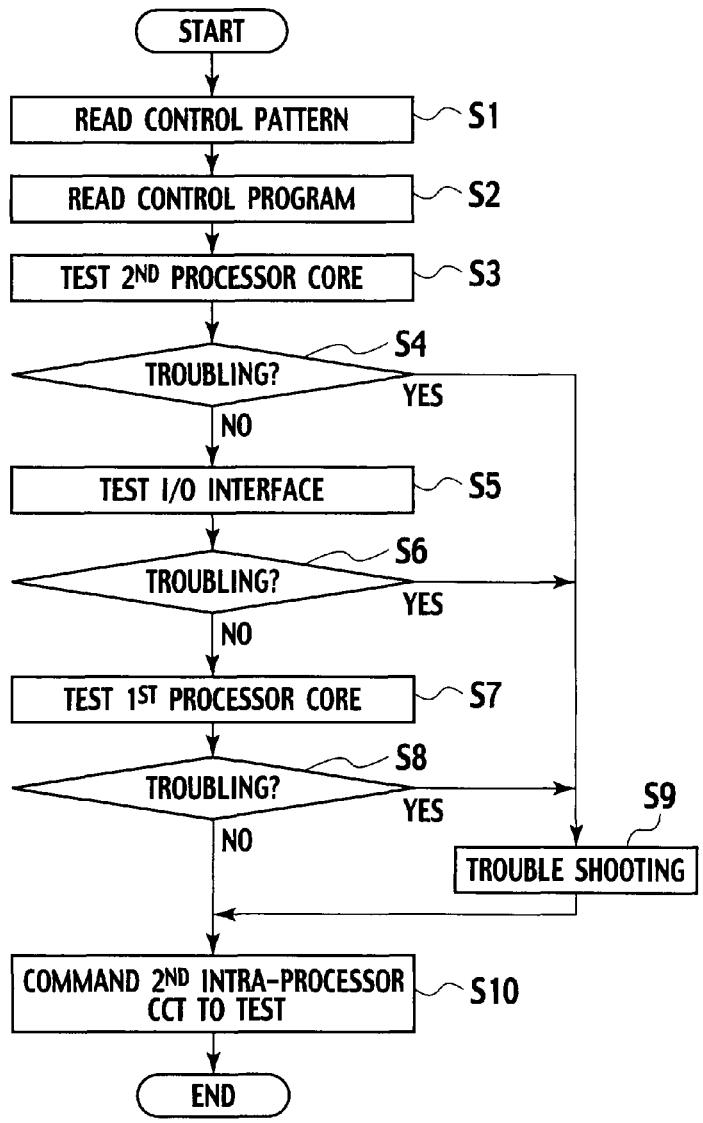

CONTROL APPARATUS

CROSS-REFERENCE TO RELATED APPLICATION

This application is based upon and claims the benefit of priority from the prior Japanese Patent Application No. 2007-165288, filed on Jun. 22, 2007. The entire contents of which are incorporated herein by reference.

BACKGROUND OF THE INVENTION

1. Field of Art

The present invention relates to a control apparatus for controlling a process, such as in a steel-making plant or a petrochemical plant, and particularly, to a control apparatus including an operator provided with processor cores, and subjected to boundary scan tests.

2. Description of Relevant Art

A boundary scan test (sometimes referred herein simply to "JTAG test") proposed by the JTAG (Joint Test Action Group) was standardized as the IEEE Standard 1149.1-1990, as a method of testing electronics implemented with integrated circuits difficult of a probing board inspection.

The JTAG test will be described with reference to FIG. 11. For the JTAG test, for example, control apparatuses are configured with: a pair of JTAG testers 83 and 84 as testing circuits having target circuits 85 and 86 mounted thereon for their boundary scans; a set of dedicated lines 87 for a daisy chain connection of the JTAG testers 83 and 84; a JTAG controller 82 for driving the JTAG testers 83 and 84 to perform the scans; and a PC (personal computer) 81 provided with a boundary scan control program for controlling the JTAG controller 82.

Typically, the set of dedicated lines 87 includes a pair of signal lines being a TDI (i.e. a signal line connected to a 'Test Data Input' terminal) and a TDO (i.e. a signal line connected to a 'Test Data Output' terminal) to be connected in series, and a triple of control lines being a TMS (i.e. a signal line connected to a 'Test Mode Select' terminal), a TCK (i.e. a signal line connected to a 'Test ClocK' terminal), and a TRST (i.e. a signal line connected to a 'Test ReSeT' terminal) to be connected in parallel. Such a set of lines is provided as a boundary scan bus.

As illustrated in FIG. 11, signal lines TDI for data to be input and signal lines TDO for data to be output are chained for a serial connection through the JTAG tester 83, target circuit 85, JTAG tester 84, and target circuit 86, starting from and ending on the JTAG controller 82. The control lines are connected in parallel to the target circuits, and serve to control the transfer of input data and output data through the signal lines TDI and TDO.

The JTAG tester 83 has: a set of I/O (input/output) terminals 83a corresponding to I/O pins 83c of the target circuit 85 to be mounted; and a set of boundary scan cells 83b for scanning input data and output data between the set of I/O terminals 83a and the target circuit 85. The JTAG tester 83 is configured to shift a sequence of bits serially output from the JTAG controller 82 as data to be input through a signal line TDI, and whole output data from associated boundary scan cells 83b as data to be output through a signal line TDO.

Likewise, the JTAG tester 84 has: a set of I/O terminals 84a corresponding to I/O pins 84c of the target circuit 86 to be mounted; and a set of boundary scan cells 84b for scanning input data and output data between the set of I/O terminals 84a and the target circuit 86. The JTAG tester 84 is configured to shift a sequence of bits serially output from the JTAG controller 82 as data to be input through a signal line TDI, and whole output data from associated boundary scan cells 84b as data to be output through a signal line TDO.

The JTAG controller 82 follows the boundary scan control program, as it is preset, to transmit serial data to be input through a signal line TDI, receive output data from the target circuits 85 and 86, through a signal line TDO, and compare those output data with preset reference value data, to determine whether or not the output data are conforming.

The I/O terminals 83a and 84a are connected to a normal bus 88 for transmission of input signals and output signals to be processed therethrough in a normal control mode where the target circuits 85 and 86 per se work.

For an improved integrity of electronics provided with such JTAG testers, there have been proposed techniques in which an electronic apparatus per se is configured to function each time when powered on, for an automatic boundary scan to diagnose itself for a normality (refer to patent document 1).

Patent document 1: Japanese Patent Application Laying-Open Publication No. 9-5400

Conventional boundary scan testing devices have been unable to quickly cope with accidental troubles thereon, and some have employed a boundary scan controlling device to have simple boundary scan commands executed for, among others, a startup of a self-testing function to boundary scan compliance ICs on a printed circuit board, or a read-in from specific registers in such IC's (refer to patent document 2).

Patent document 2: Japanese Patent Application Laying-Open Publication No. 2000-206202

On the other hand, in the field of a control apparatus for controlling processes, such as in a steel-making or petrochemical plant, recent years have observed a number of presentations on a control apparatus including a plurality of processor cores (sometimes called a multi-core).

Processor cores constituting the multi-core encompass, among others, a generalized processor core for processing a general-purpose command capable of a programming by software, for example, and a dedicated processor core for processing a specific operation such as for an audio or video, for example.

The former is suitable for implementation of a generic processing, and the latter affords to implement a specific processing with high speed and low power dissipation. This accounts for an increased proportion of a multi-core control apparatus configured with a plurality of processors simply generalized or dedicated, or as a hybrid of generalized or dedicated processors.

The control apparatus is accompanied by an advancing application of reconfigurable devices, e.g. an FGPA (Field Program Gate Array), a PLD (Programmable Logic Device), etc, as hardwares for processor cores to be implemented thereon. The FGPA, PLD, and the like allow for a voluntary reconfiguration of circuitry even after implementation on a substrate, as an advantage.

For occasional increases in number of protocols to be executed or revisions of standards to be complied with, circuit-reconfigurable FGPAs and PLDs have been employed for processor cores dedicated for specific processings, control cores for transmission, and so on.

Control apparatuses provided with such FPGAs or PLDs are subjected to, among others, a trouble shooting of control apparatus, and a renewal of circuitry composed of such devices in control apparatus, whereto an efficient technique using a network has been proposed (refer to patent document 3).

Patent document 3: Japanese Patent Application Laying-Open Publication No. 2001-306343

The patent document 3 has disclosed an apparatus with FPGAs, which has a CPU, a memory, a set of networking elements, and the FPGAs, and is adapted to reconfigure the FPGAs' design data, from a terminal allowed to have an access to the apparatus with FPGAs through a managing apparatus linked by a network.

With a recent trend for a control apparatus to be provided with a plurality of processor cores, there is a tendency for the control apparatus to have an enlarged circuit scale, with an increase in number of I/O pins of integrated circuits constituting processor cores or the like.

Concurrently with the increase in pin number of integrated circuits, micro-fabrication of wiring is advancing in such integrated circuits, as well as on substrates for integrated circuits to be mounted thereon, whereby it is becoming important for a secured integrity of control apparatus to provide functions of, among others, finding defaults due to break or contact failure upon implementation of integrated circuits on substrates, and defective locations in circuitry of the integrated circuits per se, and reconfiguring integrated circuits in trouble.

For such troubles that might be occasional, inspections by in-circuit testers could not afford to quickly cope with, and the control apparatus should be adapted to perform boundary scan tests even in its working state.

For the electronic described in the patent document 1, it is possible to perform boundary scan tests to integrated circuits realizing principal functions of the electronic, to thereby inspect them for a normality. However, there is no provision of a mechanism for inspecting such testing devices per se that are provided to perform the boundary scan tests.

There is thus no way to perform a self-diagnosis for a normality in the boundary scan testing devices, and it is impossible to discriminate whether troubling is a boundary scan testing device or an integrated circuit as a test target, as a problem.

The testing devices are put in a similar environment to integrated circuits, and are subjected to troubles like the integrated circuits. The provision of testing devices thus constitutes an addition of non-testable devices impeding enhancement of integrity of the apparatus, as an issue.

For the printed circuit board described in the patent document 2 also, there is a problem to occur like the patent document 1. That is, although the patent document 2 includes a boundary scan controller of a simplified type adapted to diagnose boundary scan compliance ICs, it is impossible for the printed circuit board to solely diagnose the simplified boundary scan controller itself, as a problem.

For the apparatus with FPGAs described in the patent document 3, it is permitted to receive the FPGAs' design data given via the managing apparatus linked by the network, allowing for a renewal of internal circuits of FPGAs of the apparatus.

However, for the renewal of FPGA circuits, the apparatus with FPGAs should have a renewal processor to implement a renewal processing therein, but is disabled to handle the renewal processor per se as a renewal target, with a necessity for a renewal of design data of the renewal processor itself to provide this renewal processor with another renewal processor, as a problem.

SUMMARY OF THE INVENTION

The present invention has been devised in view of such points. It therefore is an object of the present invention to provide a control apparatus adapted for self-diagnoses of processor cores of an operator of the control apparatus and devices for their self-diagnoses, allowing for boundary scan tests even when running, and self-repairing of defective locations of processor cores of the operator.

According to an aspect of the present invention, a control apparatus comprises an operator including a pair of processor cores connected to a boundary scan bus, and adapted to mutually diagnose opponent process or cores in between, a memory configured to store therein data and programs to be executed by the operator, an I/O interface configured for input and output signals to be processed for associated processes in the operator, and a normal bus configured for normal connections among the operator, the memory, and the I/O interface, the operator comprises a first generalized processor core and a second generalized processor core each respectively connected to the boundary scan bus, the memory has a set of a first boundary scan control program and a second boundary scan control program for the operator to perform boundary scan tests, a first expected value data and a second expected value data each respectively to determine a conformity of a result of an associated boundary scan test, and a control program for the operator to perform a control, the first generalized processor core comprises a first boundary scan tester, a first intra-processor circuit to be tested by the first boundary scan tester, and a control pattern setter configured for selection of the control program or the set of the first and second boundary scan control programs, whichever is to be executed by the operator, to have a control pattern of the control apparatus preset to the first intra-processor circuit, the second generalized processor core comprises a second boundary scan tester, and a second intra-processor circuit to be tested by the second boundary scan tester, and the control pattern is followed for a time-dividing implementation of and between a boundary scan test to be performed to the second generalized processor core, through the boundary scan bus, by and from the first intra-processor circuit having the first boundary scan control program sampled there-for, and a boundary scan test to be performed to the first generalized processor core, through the boundary scan bus, by and from the second intra-processor circuit having the second boundary scan control program sampled there-for, depending on a diagnosis request command received from the first intra-processor circuit, through the normal bus, in accordance with a setting of the control pattern.

According to another aspect of the present invention, a control apparatus comprises an operator including a pair of processor cores connected to a boundary scan bus, and adapted to mutually diagnose opponent processor cores in between, a memory configured to store therein data and programs to be executed by the operator, an I/O interface configured for input and output signals to be processed for associated processes in the operator, and a normal bus configured for normal connections among the operator, the memory, and the I/O interface, the operator comprises a first generalized processor core and a second dedicated processor core each respectively connected to the boundary scan bus, the memory has a set of a third boundary scan control program and a fourth boundary scan control program for the operator to perform boundary scan tests, a third expected value data and a fourth expected value data each respectively to determine a conformity of a result of an associated boundary scan test, and a control program for the operator to perform a control, the first generalized processor core comprises a first boundary scan tester, a first intra-processor circuit to be tested by the first boundary scan tester, and a control pattern setter configured for selection of the control program or the third boundary scan control program, whichever is to be executed by the operator, to have a control pattern of the control apparatus preset to the first intra-processor circuit, the second dedicated processor core comprises a fifth boundary scan tester, a fifth intra-processor circuit to be tested by the fifth boundary scan tester, and a boundary scan controller configured to test the first generalized processor core connected to the boundary scan bus, and the control pattern is followed for a time-dividing implementation of and between a boundary scan test to be performed to the second dedicated processor core, through the boundary scan bus, by and from the first intra-processor circuit having the third boundary scan control program sampled therefor, and a boundary scan test to be performed to the first generalized processor core, through the boundary scan bus, by and from the boundary scan controller driven by the fifth intra-processor circuit with a diagnosis request command received in accordance with the control pattern, from the first intra-processor circuit, through the normal bus.

According to another aspect of the present invention, a control apparatus comprises an operator comprising a plurality of processor cores connected to a boundary scan bus, and boundary scan tested from each other for a mutual diagnosis in between in a time-dividing manner.

According to any one of the aspects, a control apparatus is adapted for self-diagnoses of processor cores of an operator of the control apparatus and devices for their self-diagnoses, allowing for boundary scan tests even when running, and self-repairing of defective locations of processor cores of the operator.

BRIEF DESCRIPTION OF THE DRAWINGS

FIG. 3 is a table listing exemplary modes of a control pattern in accordance with the present invention.

FIG. 4 is a flowchart of control actions for JTAG tests according to the first embodiment of the present invention.

DETAILED DESCRIPTION OF THE EMBODIMENTS

Figure 1:
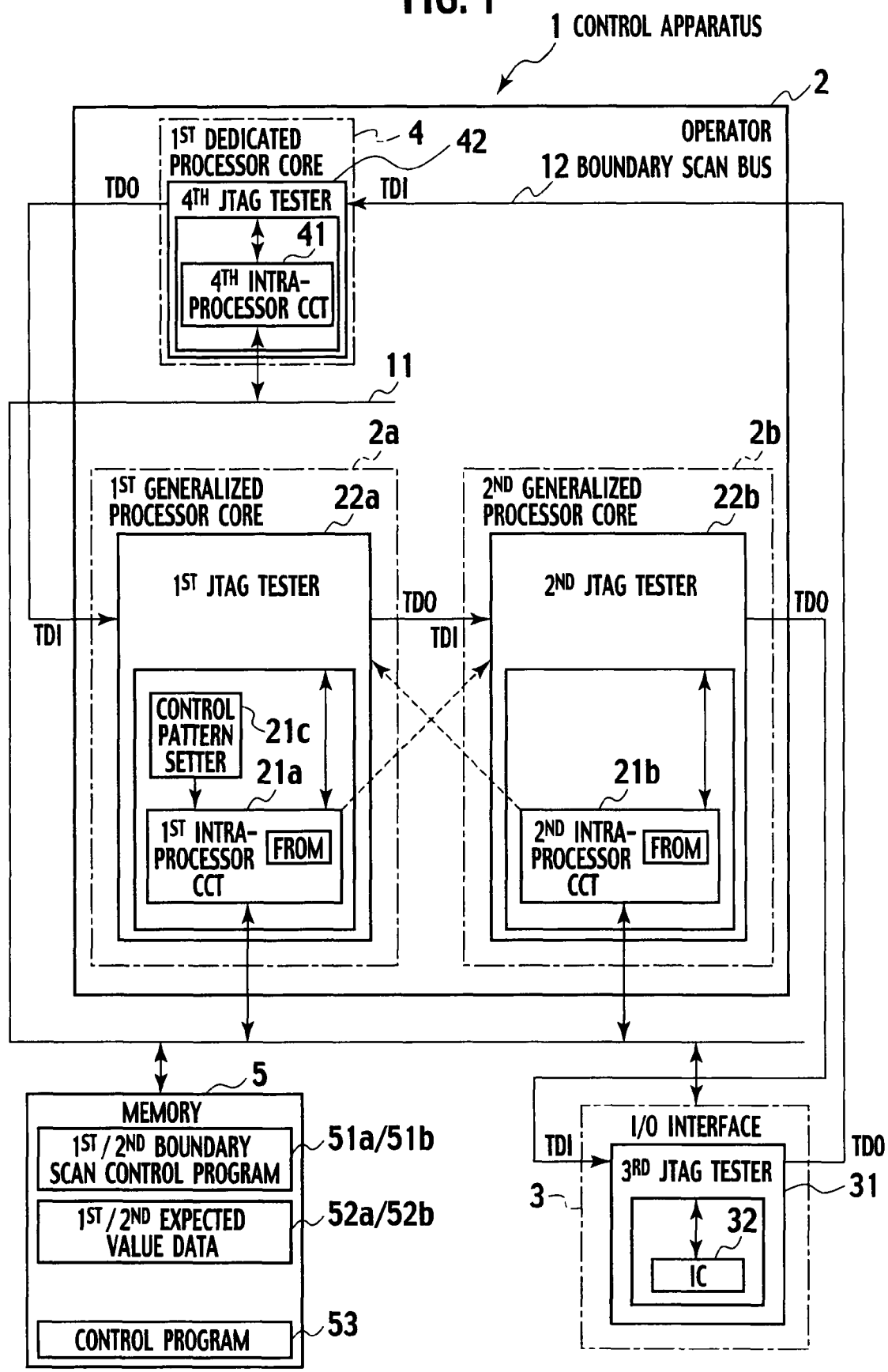
FIG. 1 is a block diagram of a control apparatus according to a first embodiment of the present invention.

There will be described embodiments of the present invention, with reference to the drawings.

First Embodiment

There will be described below a first embodiment of the present invention, with reference to FIG. 1 to FIG. 4. Description is now made with reference to FIG. 2, which illustrates a configuration of a JTAG testing device for a self-diagnosing test in accordance with the present invention. Relative to the JTAG testing device in FIG. 11, like elements are designated by like reference characters in FIG. 2, to eliminate redundant description.

Figure 2:
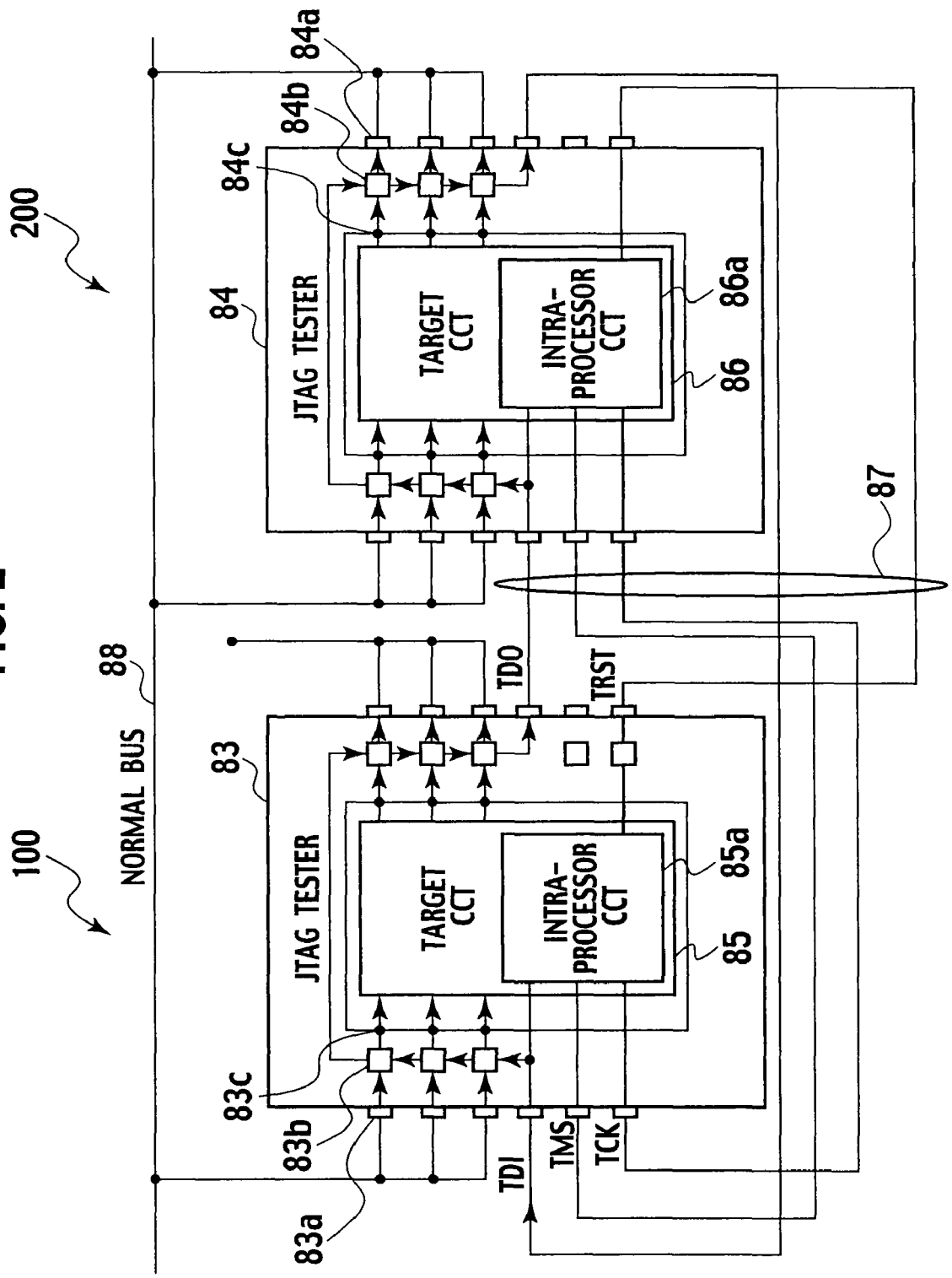
FIG. 2 is a block diagram illustrating a testing configuration in accordance with the present invention.
Figure 11:
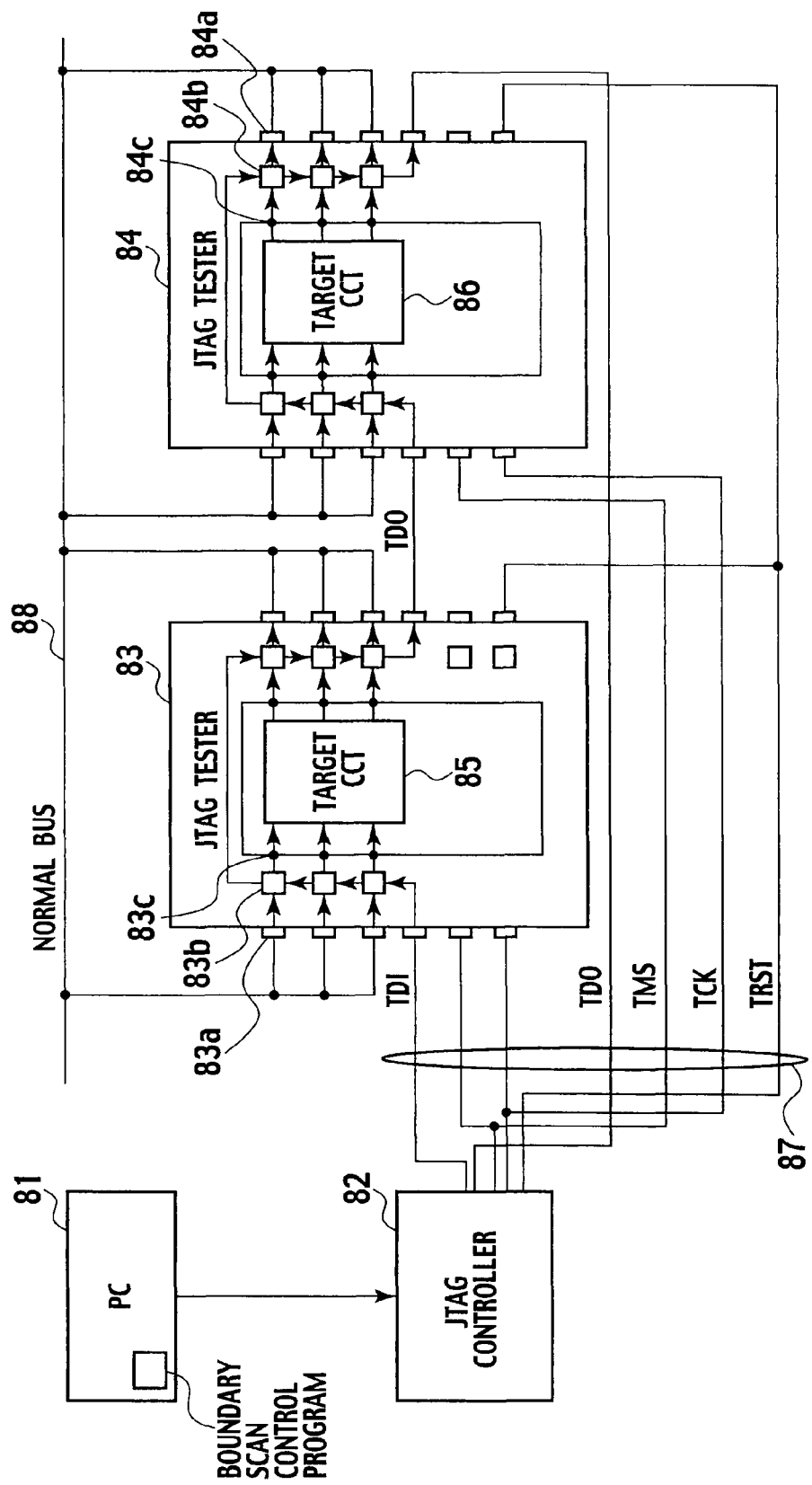
FIG. 11 is a block diagram of a conventional boundary scan tester.

The JTAG testing device illustrated in FIG. 2 is different from the JTAG testing device in FIG. 11. In the latter, boundary scans on the target circuits 85 and 86 connected to a boundary scan bus are controlled from the JTAG controller 82 following a boundary scan control program provided in the PC 81. Instead, in the former, an intra-processor circuit 85a mounted on a target circuit 85 is configured to test a processor core 200 composed of a JTAG tester 84 and another target circuit 86, and another intra-processor circuit 86a mounted on this target circuit 86 is configured to test a processor core 100 composed of another JTAG tester 83 and that target circuit 85a.

In other words, paired processor cores 100 and 200 are each respectively configured with a boundary scan tester, and an intra-processor circuit to be tested by the boundary scan tester, and cooperatively work for a mutual diagnosis, such that the intra-processor circuit 85a at one side diagnoses a processor core 200 at the other side, and the intra-processor circuit 86a at this side diagnoses a processor core 200 at that side.

The processor core 100 and the processor core 200 are mutually connected for their boundary scan tests by a boundary scan bus composed of a dedicated line set 87 of five lines as a combination of serially connected signal lines TDI and TDO and parallel-connected control lines TMS, TCK, and TRST, whereby the intra-processor circuit 85a at one side is adapted to drive the boundary scan tester 84 at the other side, so that this boundary scan tester 84 and its intra-processor circuit 86a, both mounted typically on a substrate, are tested at once.

Likewise, the intra-processor circuit 86a at this side is adapted to drive the JTAG tester 83 at that side, so that this JTAG tester 84 and its intra-processor circuit 85a, both mounted typically on a substrate, are tested at once. Thus, both processor cores are adapted to mutually diagnose entireties of opponent processor cores in a time-dividing manner.

Both intra-processor circuits 85a and 86a have their I/O terminals 83a and 84a connected to a normal bus 88, so they can make their normal control actions through the bus 88, while boundary scan tests are performed through the boundary scan bus. In this configuration, the control and the testing are performed in a time-dividing manner.

Description is now made of a control apparatus 1 according to the first embodiment, with reference to FIG. 1, where the foregoing concept of JTAG testing device prevails. The control apparatus 1 is configured for a self-diagnosis function, with: an operator 2 including a mutually diagnosing combination of first and second generalized processor cores 2a and 2b and a first dedicated processor core 4; a memory 5 for storing therein programs to be executed by the operator 2; an I/O interface 3 adapted for a processing for input and output signals to be controlled in the operator 2; and a normal bus 11 for normal connections and control within and among the operator 2, the memory 5, and the I/O interface 3.

The first generalized processor core 2a, second generalized processor core 2b, and first dedicated processor core 4 are interconnected for JTAG tests by a boundary scan bus 12.

Description is now made of component configurations. The operator 2 is implemented with the first generalized processor core 2a, the second generalized processor core 2b, and the first dedicated processor core 4, which are formed as a combination on a common substrate, or as individual units on separate substrates.

Those processor cores may be formed on separate semiconductor chips connected by inter-chip wirings, or on separate dies on a single semiconductor chip, the dies being connected by intra-chip wirings. In either case, the configuration in block diagram is identical to FIG. 1.

For each of first generalized processor core 2a, second generalized processor core 2b, and first dedicated processor core 4, its signal line TDI is serially connected a signal line TDO of another core, while unshown control lines are connected in parallel. Such signal lines and control lines constitute the boundary scan bus 12.

Although three processor cores are mounted in the embodiment, the number of processor cores to be implemented is not limited, providing that mounted two or more permit necessary connections by boundary scan bus.

The first generalized processor core 2a, the second generalized processor core 2b, and the first dedicated processor core 4 have their I/O signal lines connected to the normal bus 11 of the control apparatus 1, which permits the operator 2 to give and receive control data to and from the memory 5 and the I/O interface 3, as necessary for execution of an associated control program.

The first generalized processor core 2a includes: a first JTAG tester 22a connected to the boundary scan bus 12; a first intra-processor circuit 21a connected at one end thereof to the first JTAG tester 22a and at another end thereof to the normal bus 11, to be tested by the first JTAG tester 22a; and a control pattern setter 21c connected to the first intra-processor circuit 21a and configured to select a control program 53 or a first boundary scan control program 51a, whichever is to be executed by the operator 2, and have a control pattern of the control apparatus 1 preset to the first intra-processor circuit 21a.

Description is now made of the control pattern to be set by the control pattern setter 21c, with reference to FIG. 3. The control pattern is set as a selected one of three control modes: a "run" mode in which the control apparatus 1 runs simply under a normal control; an "intermittent test" mode in which the normal control is kept, while boundary scan tests are performed at preset periodical intervals without affecting the normal control; and a "test" mode in which simply boundary scan tests are performed.

The first intra-processor circuit 21a, as well as a later-described second intra-processor circuit 21b, performs a boundary scan test by a preset period, whereto a control pattern is preset by the control pattern setter 21c, and is read by the first intra-processor circuit 21a, and transmitted therefrom through the normal bus 11 to the second intra-processor circuit 21b, where it is set.

The second generalized processor core 2b includes: a second JTAG tester 22b connected to the boundary scan bus 12; and the above-noted second intra-processor circuit 21b, which is connected at one end thereof to the second JTAG tester 22b and at another end thereof to the normal bus 11, to be tested by the second JTAG tester 22b.

The first dedicated processor core 4 includes: a fourth JTAG tester 42 connected to the boundary scan bus 12; and a fourth intra-processor circuit 41 connected at one end thereof to the fourth JTAG tester 42 and at another end thereof to the normal bus 11, to be tested by the fourth JTAG tester 42.

The I/O interface 3 includes: a third JTAG tester 31 connected to the boundary scan bus 12; and an integrated circuit 32 connected to and tested by the third JTAG tester 31. The I/O interface 3 is connected to the normal bus 11, for transfer of input and output signals.

The memory 5 has stored therein: a set of a first boundary scan control program 51a and a second boundary scan control program 51b for the operator 2 to perform boundary scan tests; a set of a first expected value data 52a and a second expected value data 52b each respectively to determine a conformity of a result of an associated boundary scan test; and the control program 53 for the operator 2 to perform a normal control.

The first intra-processor circuit 21a samples the first boundary scan control program 51a and the first expected value data 52a, for use when boundary scan testing the second generalized processor core 2b. The second intra-processor circuit 21b samples the second boundary scan control program 51b and the second expected value data 52b, for use when boundary scan testing the first generalized processor core 2a.

The first boundary scan control program 51a and the second boundary scan control program 51b, as well as the first expected value data 52a and the second expected value data 52b, should correspond to configurations of the first intra-processor circuit 21a and the second intra-processor circuit 21b, respectively. Accordingly, those will be different from each other, unless these are identical. However, if these are identical, those will also be identical, and will do with a set of control programs of a kind, and a set of value data of a kind.

Description is now made of actions of the control apparatus 1, with reference to the flowchart of FIG. 4. First, a control pattern preset by the control pattern setter 21c, to be "intermittent test" or "test" mode, is read by the first intra-processor circuit 21a (step S1), and the first boundary scan control program 51a as a corresponding program is sampled from the memory 5 by the first intra-processor circuit 21a per se, where it is read in a register (step S2).

The read first boundary scan control program 51a is followed, whereby the second processor core 2b is tested (step S3).

That is, in accordance with the first boundary scan control program 51a, a test signal is sent from the first intra-processor circuit 21a, through the boundary scan bus 12, to the second JTAG tester 22b, where it is sent to the second intra-processor circuit 21b, where a JTAG test is performed.

More specifically, the first intra-processor circuit 21a works to: send a test signal for testing the second processor core 2b, as an input signal through a signal line TDI of the boundary scan bus 12 to the second JTAG tester 22b; receive an output signal through a signal line TDO of the second JTAG tester 22b; and compare this with a preset first expected value data 52a for the second processor core 2b, to determine whether or not a trouble is present (step S4).

For a determination for presence of a trouble, an unshown preset trouble shooting program in the first boundary scan control program 51a is followed, to thereby execute a trouble shooting process including an interruption of control, notification, etc. (step S9).

Likewise, the first intra-processor circuit 21a sequentially performs: for the I/O interface 3, a test (step S5), and a determination of whether or not a trouble is present (step S6); and for the first dedicated processor core 4, a test (step S7), and a determination of whether or not a trouble is present (step S8).

Upon completion of whole tests on targets connected to the boundary scan bus 12, the first intra-processor circuit 21a gives, through the normal bus 11, a command to have the second intra-processor circuit 21a start a JTAG test.

Then, the second intra-processor circuit 21b works to: sample from the memory 5 the second boundary scan control program 51b and the second expected value data 52b; perform tests on targets connected to the boundary scan bus 12, i.e., the first generalized processor core 2a, the first dedicated processor core 4, and the I/O interface 3, in a prescribed order; determine whether or not a trouble is present for each of them; and execute a trouble shooting process if any trouble is present.

For the second intra-processor circuit 21b, control actions are similar to steps S1 to S9 in the flowchart of FIG. 4.

It is noted that the first intra-processor circuit 21a and the second intra-processor circuit 21b may do well with configurations for mutual tests on the second processor core 2b and the first processor core 2a, respectively. Other targets may be tested by either or both of them.

For presence or absence of a trouble to be determined by JTAG tests (step S8), decisions may depend on e.g. coincidence between input data and output data to judge states of connections up to I/O pins of intra-processor circuits and JTAG testers.

Defaults in intra-processor circuits may be determined from functional tests of intra-processor circuits.

For troubles identified by such determination, if they are e.g. circuit troubles, the trouble shooting process (step S9) may include a forced output of preset fail-safe data, or external trouble notification.

According to the embodiment described, a control apparatus 1 includes a pair of generalized processor cores each configured with a testing means to perform a boundary scan test and a target means to be boundary scan tested, thus allowing boundary scan tests to be mutually made.

Configurations in the past had no means for testing a testing device per se needed to perform a boundary scan test, and were unable to self-diagnose the testing device for a trouble. However, according to the present embodiment in which processor cores can be mutually boundary scan tested, the control apparatus 1 can be free of integrated circuits left unable to be self-diagnosed, allowing for an enhanced integrity in an entirety of the control apparatus 1.

Moreover, troubles can be found in a self-diagnosing manner, without provision of additional testing devices, and hence without increased component numbers. The control apparatus is thus allowed to have an enhanced operation rate and an enhanced integrity together.

Further, the control apparatus can be boundary scan tested inside, without interrupting control of its inherent processes, whereby troubles can be detected while running, thus allowing for an early detection of informality by self-diagnoses, even with severe restrictions to operation of control apparatus, such as response time.

Second Embodiment

Figure 5:
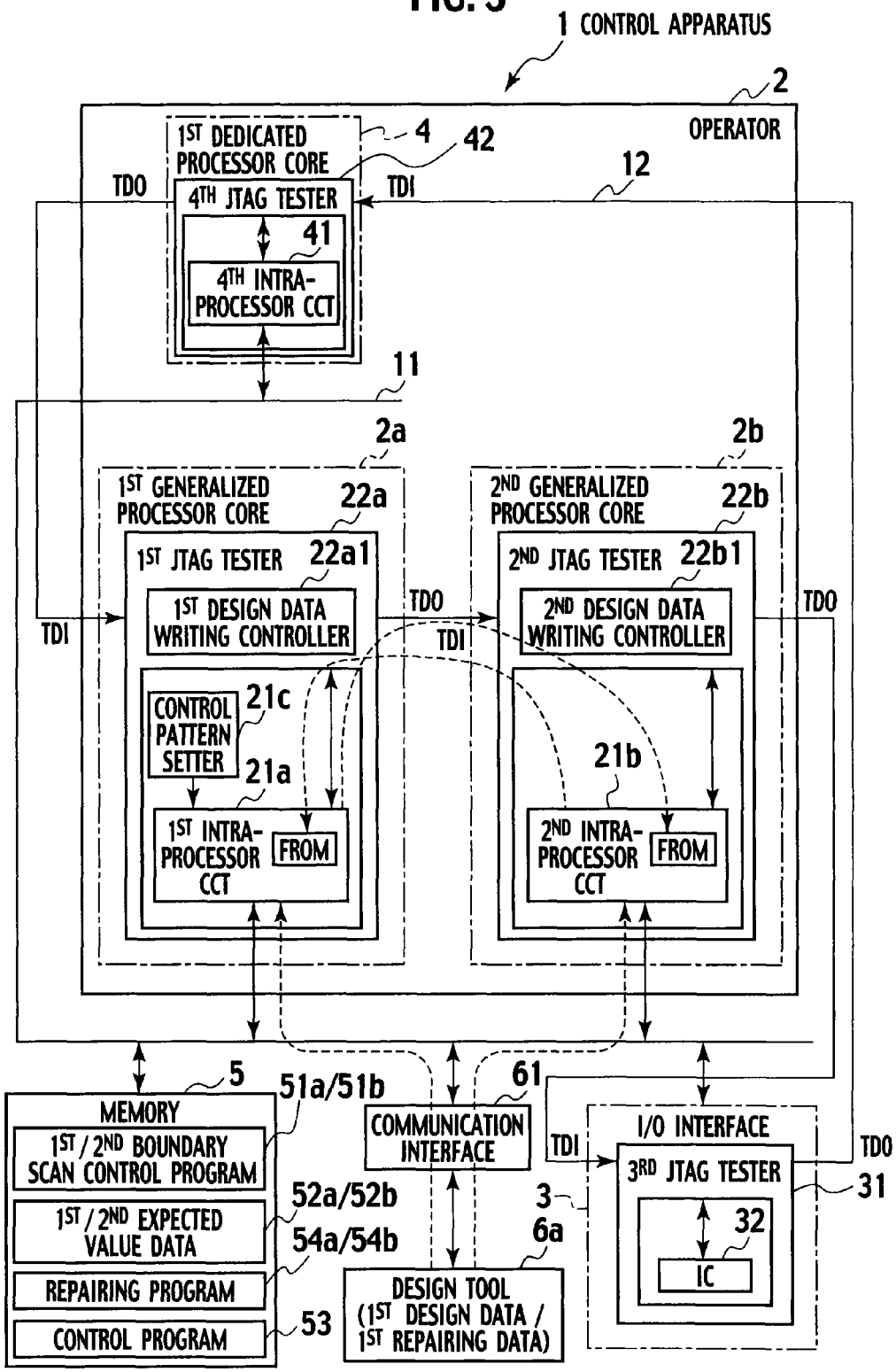
FIG. 5 is a block diagram of a control apparatus according to a second embodiment of the present invention.
Figure 6:
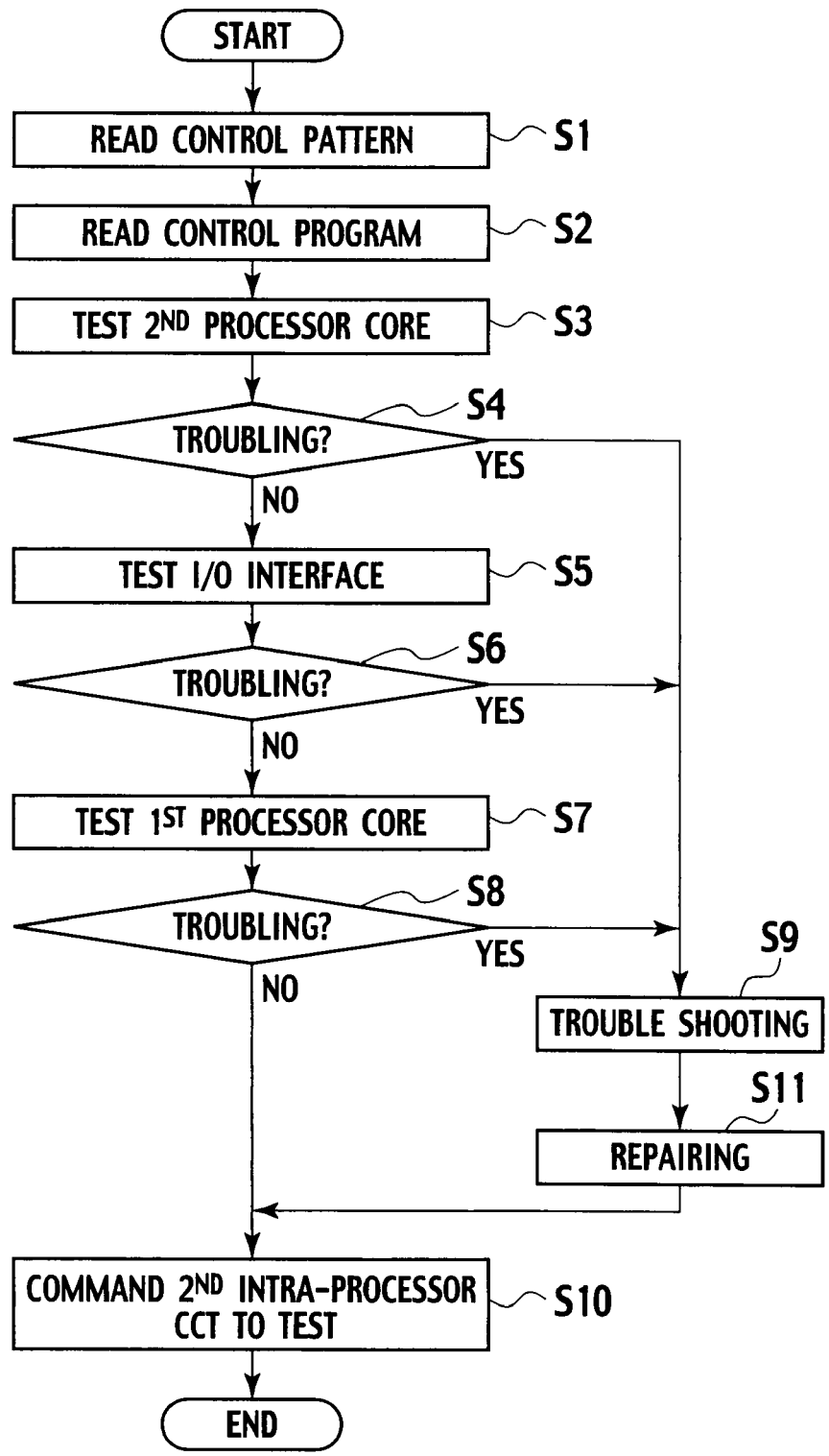
FIG. 6 is a flowchart of control actions for JTAG tests according to the second embodiment of the present invention.

Description is now made of a control apparatus 1 according to a second embodiment of the present invention, with reference to FIG. 5 and FIG. 6. Relative to the control apparatus 1 in the first embodiment, like elements are designated by like reference characters in FIG. 5, to eliminate redundant description.

The second embodiment is different from the first embodiment, as follows: In the latter, after mutual boundary scan tests on the generalized processor cores, their results are checked at the step S8 in the flowchart of FIG. 4, and if any trouble is found there, the control flow goes to the step S9 to execute the troubleshooting process. Instead, in the former, design data and repairing data of intra-processor circuits are provided, and if any trouble is found in any intra-processor circuit at a step S8 in a flowchart of FIG. 6, the control flow goes to a step S9 to execute a trouble shooting process, and additionally to a step S11 to execute a repairing process for repairing the intra-processor circuit.

According to the second embodiment, the control apparatus 1 has implemented: a first design data writing controller 22a1 in a first JTAG tester 22a; and a second design data writing controller 22b1 in a second JTAG tester 22b.

Further, it has: a design tool 6a configured to store therein first design data and first repairing data of a first intra-processor circuit 21a and a second intra-processor circuit 21b, and connected through a communication interface 61 therefor to a normal bus 11; and a combination of a repairing program 54a for the first intra-processor circuit 21a and a repairing program 54b for the second intra-processor circuit 21b, stored in a memory 5.

The first intra-processor circuit 21a and the second intra-processor circuit 21b are typically provided with FPGAs or PLDs, and rewrite controllable.

The first intra-processor circuit 21a works to: perform a boundary scan test on a second processor core 2b including the second intra-processor circuit 21b; identify troubling locations and circuits therein, if any, from results of the test; and as shown by broken line arrows in FIG. 5, sample repairing data relating to such troubles from the design tool 6a, and send them through a boundary scan bus 12, whereby the second design data writing controller 22b1 is driven to rewrite corresponding design data of the second intra-processor circuit 21b stored in an associated nonvolatile memory (FROM).

Likewise, the second intra-processor circuit 21b identifies troubling locations and circuits, if any, in a first processor core 2a including the first intra-processor circuit 21a, and drives the first design data writing controller 22a1 to rewrite corresponding design data of the first intra-processor circuit 21a stored in an associated nonvolatile memory (FROM).

In the second embodiment described, the control apparatus 1 is connected with the design tool 6a by communications to acquire repairing data, and reconfigurable (rewritable) processor cores' JTAG testers are provided with writing controllers adapted for design data of troubling locations of intra-processor circuits to be rewritten by the repairing data.

Therefore, the intra-processor circuits are automatically changeable. Further, using such devices as reconfigurable while working, the intra-processor circuits can be repaired even when the control apparatus is running.

Third Embodiment

Figure 7:
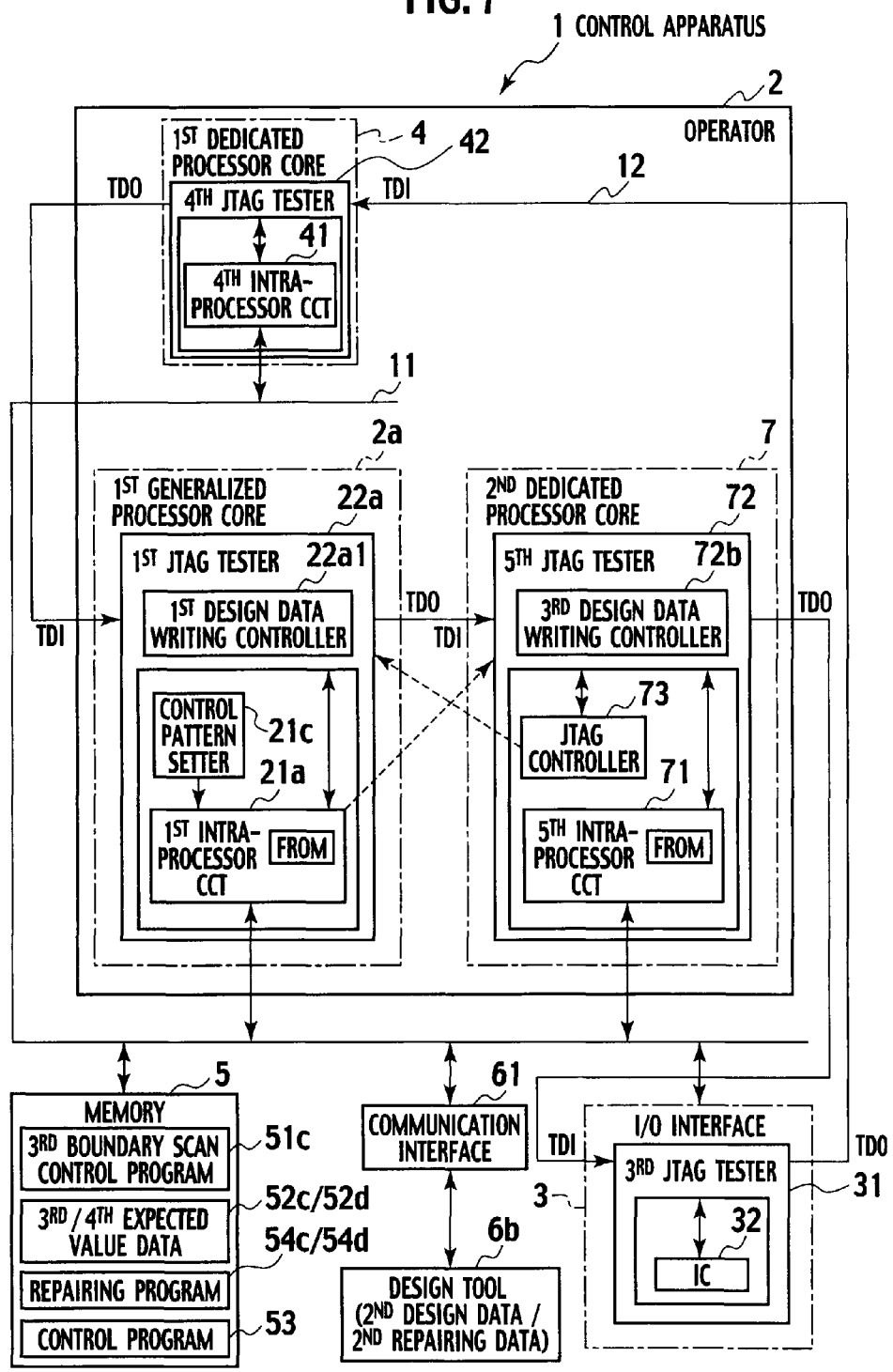
FIG. 7 is a block diagram of a control apparatus according to a third embodiment of the present invention.

Description is now made of a control apparatus 1 according to a third embodiment of the present invention, with reference to FIG. 7. Relative to the control apparatus 1 in the second embodiment, like elements are designated by like reference characters in FIG. 7, to eliminate redundant description.

The third embodiment is different from the second embodiment, as follows: In the latter, a mutual boundary scan test is performed between a pair of generalized processor cores each configured for the contents of operation to be programmable by software. Instead, in the former, a mutual boundary scan test is performed between a first generalized processor core 2a, and a second dedicated processor core 7 configured with hardware for a fixed content of operation.

In the third embodiment, the second dedicated processor core 7 is configured with: a fifth intra-processor circuit 71; a fifth JTAG tester 72 provided with a third design data writing controller 72b; and a JTAG controller 73 for commanding, through a boundary scan bus 12, a boundary scan control for a test on the first generalized processor core 2a.

It has in a memory 5: a third boundary scan control program 51c for a test on the second dedicated processor core 7; a third expected value data 52c as a reference data for determination of a trouble on a result of the test by the third boundary scan control program 51c; a fourth expected value data 52d as a reference data for determination of presence or absence of a trouble on a result of the test by the JTAG controller 73; a repairing program 54c for repairing the first generalized processor core 2a; and a repairing program 54d for repairing the second dedicated processor core 7.

Further, a design tool 6b has stored therein sets of second design data and second repairing data of a first intra-processor circuit 21a and the fifth intra-processor circuit 71.

For the control apparatus 1 configured as described in accordance with the third embodiment, description is now made of the second dedicated processor core 7 given a command for a test from the first intra-processor circuit 21a through a normal bus 11.

Given the command for a test from the first intra-processor circuit 21a through the normal bus 11, the fifth intra-processor circuit 71 commands the JTAG controller 73 to start the test.

Then, the JTAG controller 73 works to: perform the test on the first processor core 2a through the boundary scan bus 12; and compare a result of the test with the fourth expected value data 52d; and for any trouble identified, to drive the repairing program 54d, to sample a second repairing data, and control a third design data writing controller 22a1 to write the repairing data in a nonvolatile memory (FROM) of the first intra-processor circuit 21a.

In the third embodiment, the first intra-processor circuit 21a performs a boundary scan test on the second dedicated processor core 7, whereof associated actions are identical to the first embodiment providing that the former substitutes the second dedicated processor core 7 for the second generalized processor core 2b in the latter, and redundant description is omitted.

According to the third embodiment described, a generalized processor core and a dedicated processor core, paired for use, are each configured with a testing means to perform a boundary scan test and a target means to be boundary scan tested, thus allowing boundary scan tests to be mutually made even in the pair of processor cores including a dedicated one.

Fourth Embodiment

Figure 8:
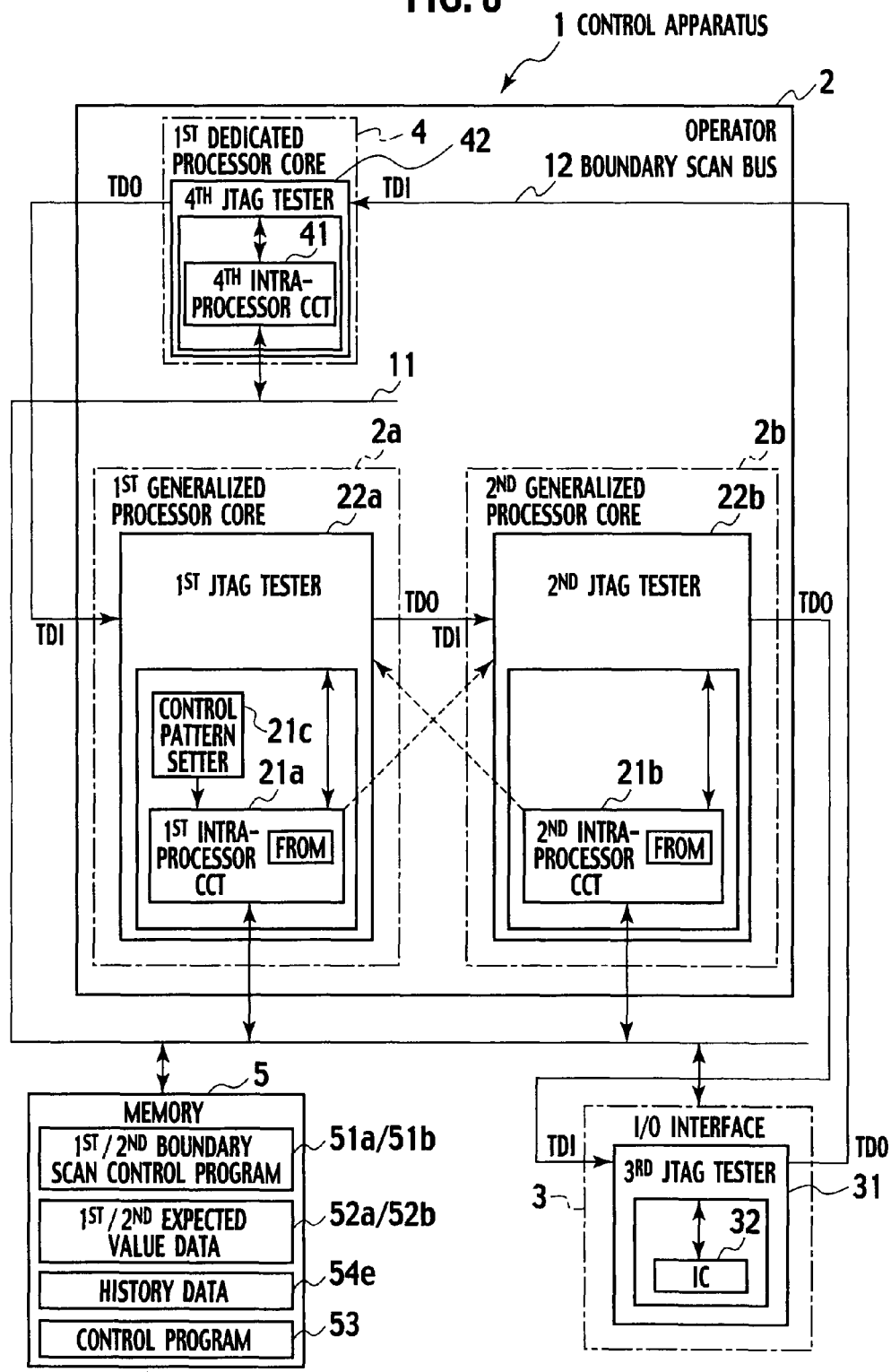
FIG. 8 is a block diagram of a control apparatus according to a fourth embodiment of the present invention.
Figure 9:
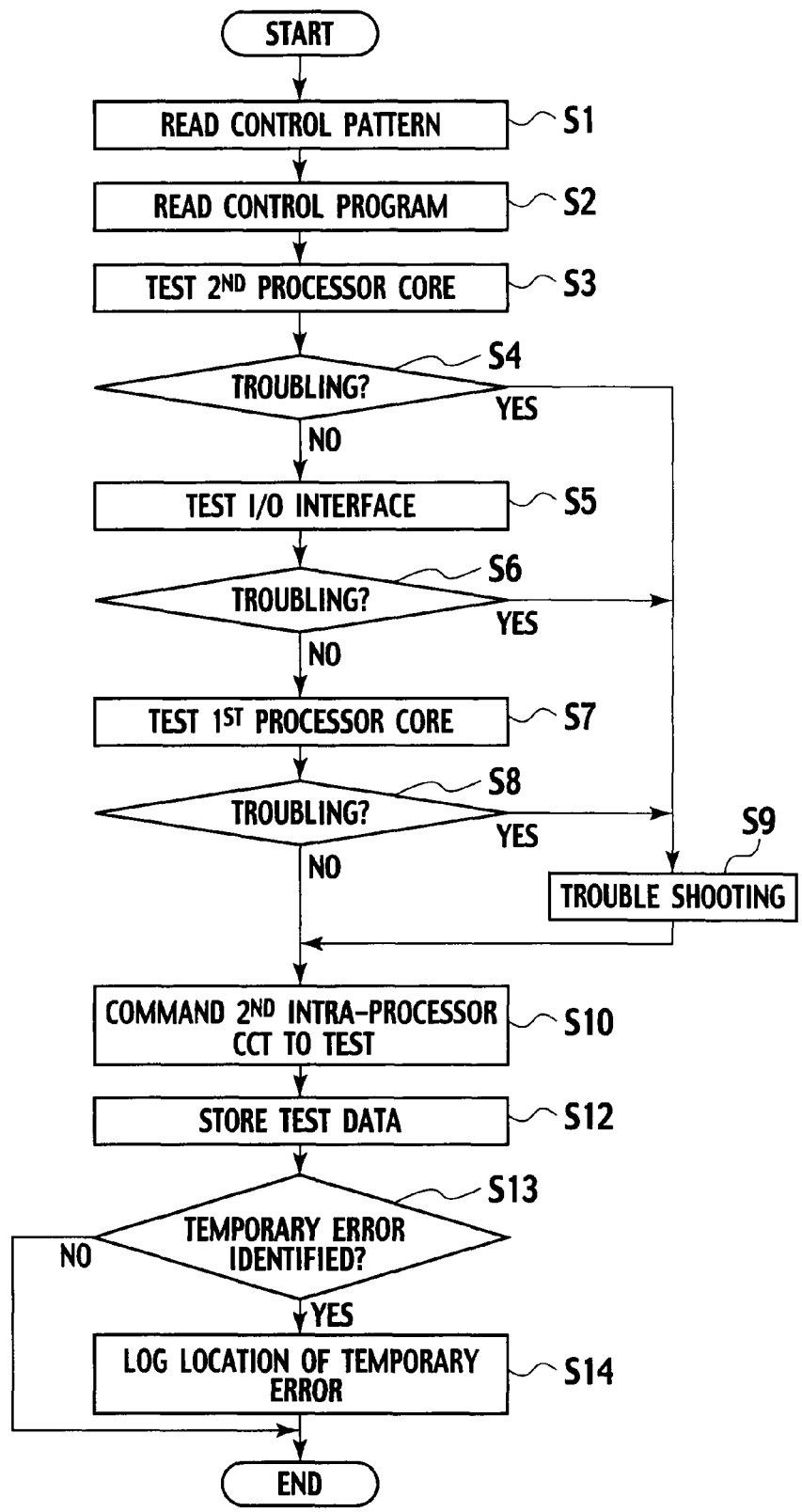
FIG. 9 is a flowchart of control actions for JTAG tests according to the fourth embodiment of the present invention.
Figure 10:
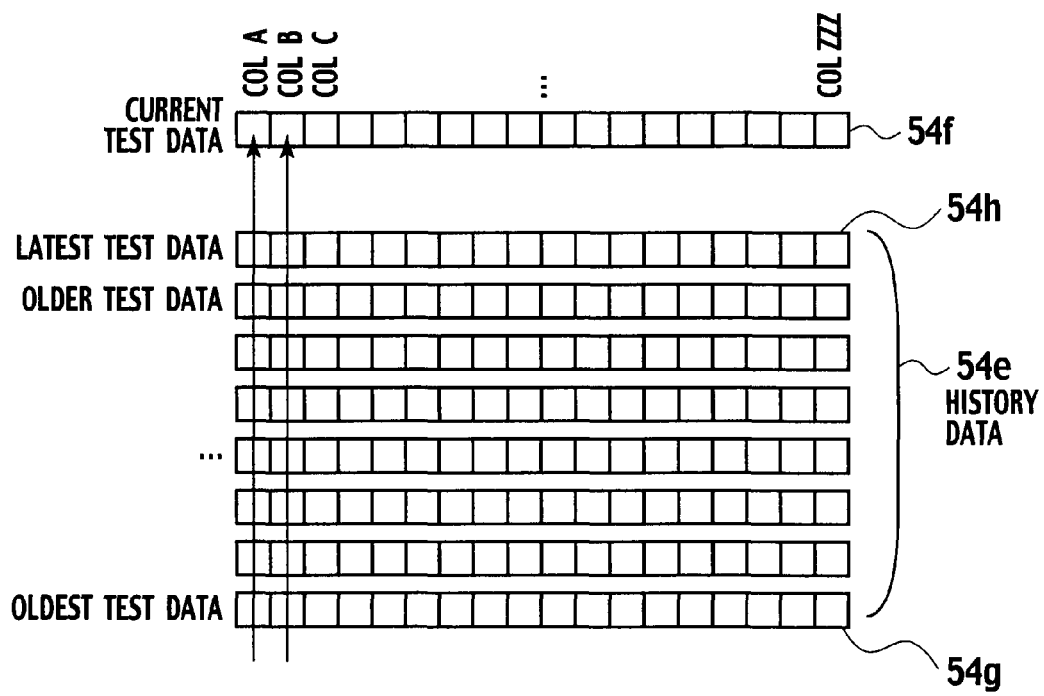
FIG. 10 is a diagram of a structure of a set of test history data in the control apparatus according to the fourth embodiment of the present invention.

Description is now made of a control apparatus 1 according to a fourth embodiment of the present invention, with reference to FIG. 8 to FIG. 10. Relative to the control apparatus 1 of the first embodiment shown in FIG. 1, the former is different in that a memory 5 has stored therein a number of rows of test data as a set of test history data 54e, and like elements are designated by like reference characters in FIG. 8, to eliminate redundant description.

The third embodiment includes a configuration for a check for a transient error occurring in an intermittent test mode, to continue this mode upon an occurrence of transient error. More specifically, as shown in a flowchart of FIG. 9, after a sequence of steps S1 to S10 corresponding to those for an intermittent test in the flowchart of the first embodiment shown in FIG. 4, the third embodiment has an additional step S12 for a current string of test data 54f to be stored in a region of test history data 54e in the memory 5, as illustrated in FIG. 10, where strings of test data in the past are stored as an array of rows to be checked by columns A, B, C, . . . , ZZZ that one-to-one correspond to testing locations in the processor cores 2a and 2b as test targets. The storage region of test history data 54e has a limited maximal size, so a row of oldest test data 54g is shifted out when the current string of test data 54f is added as a new row.

Each column in the new row of test data 54f is compared with a correspondent existing test data 54e, e.g. a correspondent data in a row of latest test data 54h, to make a check for an inconsistency in between to be recorded as an error at the column. Each time when a new row of test data 54f is added, such column-wise checks are repeated. And, if any column having a recorded error is restored to be consistent in a check within a prescribed period of time after a first recording of the error, this event is identified as an occurrence of transient error (YES at step S13), which is logged as part of an entire set of test history data 54e, together with a label of a testing location where the transient error has occurred (step S14). So long as any and all associated inconsistency is verified to be transient or in a course of verification within the prescribed period of time, as well as when no inconsistency is recorded, the intermittent test mode is kept from being interrupted, and hence is continued. It is noted that each time when a new row of test data 54f is added, its data may be column-wise sequentially compared with whole existing data 54e, from an oldest one 54g up to a latest one 54h, for verification of a transient error.

It also is noted that the foregoing boundary scan tests are made on processors, but may well be implemented for inspection of memories, such as a flush memory, using a boundary scan bus.

While preferred embodiments of the present invention have been described using specific terms, such description is for illustrative purposes, and it is to be understood that changes and variations may be made without departing from the spirit or scope of the following claims.

What is claimed is:

1. A control apparatus comprising:
an operator including a pair of processor cores connected to a boundary scan bus, and adapted to mutually diagnose opponent processor cores in between;
a memory configured to store therein data and programs to be executed by the operator;
an I/O interface configured for input and output signals to be processed for associated processes in the operator; and
a normal bus configured for normal connections among the operator, the memory, and the I/O interface, wherein
the operator comprises a first generalized processor core and a second generalized processor core each respectively connected to the boundary scan bus,
the memory has a set of a first boundary scan control program and a second boundary scan control program for the operator to perform boundary scan tests, a first expected value data and a second expected value data each respectively to determine a conformity of a result of an associated boundary scan test, and a control program for the operator to perform a control,
the first generalized processor core comprises a first boundary scan tester, a first intra-processor circuit to be tested by the first boundary scan tester, and a control pattern setter configured for selection of the control program or the set of the first and second boundary scan control programs, whichever is to be executed by the operator, to have a control pattern of the control apparatus preset to the first intra-processor circuit, the second generalized processor core comprises a second boundary scan tester, and a second intra-processor circuit to be tested by the second boundary scan tester, and the control pattern is followed for a time-dividing implementation of and between a boundary scan test to be performed to the second generalized processor core, through the boundary scan bus, by and from the first intra-processor circuit having the first boundary scan control program sampled therefor, and a boundary scan test to be performed to the first generalized processor core, through the boundary scan bus, by and from the second intra-processor circuit having the second boundary scan control program sampled therefor, depending on a diagnosis request command received from the first intra-processor circuit, through the normal bus, in accordance with a setting of the control pattern.

2. The control apparatus as claimed in claim 1, wherein the I/O interface comprises a third boundary scan tester, and an integrated circuit to be tested by the third boundary scan tester, the third boundary scan tester is connected to the boundary scan bus, and a boundary scan test is performed to the I/O interface, by and from one of the first intra-processor circuit having sampled the first boundary scan control program, and the second intra-processor circuit having sampled the second boundary scan control program.

3. The control apparatus as claimed in claim 1, wherein the operator comprises a first dedicated processor core comprising a fourth boundary scan tester, and a fourth intra-processor circuit to be tested by the fourth boundary scan tester, the first dedicated processor core is connected to the boundary scan bus, and a boundary scan test is performed to the first dedicated processor core, by and from one of the first intra-processor circuit having the first boundary scan control program sampled therefor, and the second intra-processor circuit having the second boundary scan control program sampled therefor, in accordance with an instruction of the control pattern.

4. The control apparatus as claimed in claim 1, wherein a design tool is connected to the normal bus through a communication interface, and configured to store therein a set of design data and a set of repairing data for the first intra-processor circuit and the second intra-processor circuit, the first boundary scan tester comprises a first design data writing controller connected at one end thereof to the boundary scan bus, and at another end thereof to the first intra-processor circuit, the second boundary scan tester comprises a second design data writing controller connected at one end thereof to the boundary scan bus, and at another end thereof to the second intra-processor circuit, the memory has therein a set of results of boundary scan tests, and the first expected value data and the second expected value data, the first intra-processor circuit is configured to acquire a first result of a boundary scan test of the second generalized processor core through the boundary scan bus, and compare the first result with the first expected value data for a first decision on a conformity of the first result, and for a determination for presence of a trouble after the first decision, to sample from the design tool a first repairing data as preset, and rewrite a first design data stored in a nonvolatile memory of the second intra-processor circuit by the sampled first repairing data through the second design data writing controller, and the second intra-processor circuit is configured to acquire a second result of a boundary scan test of the first generalized processor core through the boundary scan bus, and compare the second result with the second expected value data for a second decision on a conformity of the second result, and for a determination for anormality after the second decision, to sample from the design tool a second repairing data as preset, and rewrite a second design data stored in a nonvolatile memory of the first intra-processor circuit by the sampled second repairing data through the second design data writing controller.

5. The control apparatus as claimed in claim 1, wherein the control pattern comprises a run mode dedicated for a running under control by the control program, an intermittent test mode for a time-dividing implementation of and between the running and a testing under control by the first and second boundary scan control programs, and a test mode for a simple implementation of the testing.

6. The control apparatus as claimed in claim 5, wherein the intermittent test mode comprises:

storing test data of boundary scan tests;

comparing a current test data with a previous test data, preparing a history of presence or absence of difference in between;

determining whether or not the history has a pattern representing a transient error; and continuing the intermittent test mode for a determination for the transient error.

7. A control apparatus comprising:

an operator including a pair of processor cores connected to a boundary scan bus, and adapted to mutually diagnose opponent processor cores in between;

a memory configured to store therein data and programs to be executed by the operator;

an I/O interface configured for input and output signals to be processed for associated processes in the operator; and a normal bus configured for normal connections among the operator, the memory, and the I/O interface, wherein the operator comprises a generalized processor core and a dedicated processor core each respectively connected to the boundary scan bus, the memory has a set of a first boundary scan control program and a second boundary scan control program for the operator to perform boundary scan tests, a first expected value data and a second expected value data each respectively to determine a conformity of a result of an associated boundary scan test, and a control program for the operator to perform a control, the generalized processor core comprises a first boundary scan tester, a first intra-processor circuit to be tested by the first boundary scan tester, and a control pattern setter configured for selection of the control program or the first boundary scan control program, whichever is to be executed by the operator, to have a control pattern of the control apparatus preset to the first intra-processor circuit, the dedicated processor core comprises a second boundary scan tester, a second intra-processor circuit to be tested by the second boundary scan tester, and a boundary scan controller configured to test the generalized processor core connected to the boundary scan bus, and the control pattern is followed for a time-dividing implementation of and between a boundary scan test to be performed to the dedicated processor core, through the boundary scan bus, by and from the first intra-processor circuit having the first boundary scan control program sampled therefor, and a boundary scan test to be performed to the generalized processor core, through the boundary scan bus, by and from the boundary scan controller driven by the second intra-processor circuit with a diagnosis request command received in accordance with the control pattern, from the first intra-processor circuit, through the normal bus.

8. The control apparatus as claimed in claim 7, wherein a design tool is connected to the normal bus through a communication interface, and configured to store therein a set of design data and a set of repairing data for the first intra-processor circuit and the second intra-processor circuit, the first boundary scan tester comprises a first design data writing controller connected at one end thereof to the boundary scan bus, and at another end thereof to the first intra-processor circuit, the second boundary scan tester comprises a second design data writing controller connected at one end thereof to the boundary scan bus, and at another end thereof to the second intra-processor circuit, the first intra-processor circuit is configured to acquire a first result of a boundary scan test of the dedicated processor core through the boundary scan bus, and compare the first result with the first expected value data for a first decision on a conformity of the first result, and for a determination for presence of a trouble after the first decision, to sample from the design tool a first repairing data as preset, and rewrite a first design data stored in a nonvolatile memory of the second intra-processor circuit by the sampled first repairing data through the first design data writing controller, and the second intra-processor circuit is configured to acquire a second result of a boundary scan test of the generalized processor core through the boundary scan bus, and compare the second result with the second expected value data for a second decision on a conformity of the second result, and for a determination for a trouble after the second decision, to sample from the design tool a second repairing data as preset, and rewrite a second design data stored in a nonvolatile memory of the first intra-processor circuit by the sampled second repairing data through the second design data writing controller.

* * * * *